（12）United States Patent
Aliane et al.

(10) Patent No.: US 9,667,121 B2
(45) Date of Patent: May 30, 2017

(54) DEVICE FOR CONVERTING HEAT ENERGY INTO ELECTRICAL ENERGY WITH HEAT-SENSITIVE MOLECULES

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Philippe Coronel, Barraux (FR); Olivier Poncelet, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 14 days.

(21) Appl. No.: 14/892,473

(22) PCT Filed: May 22, 2014

(86) PCT No.: PCT/EP2014/060574
§ 371 (c)(1),
(2) Date: Nov. 19, 2015

(87) PCT Pub. No.: WO2014/187915
PCT Pub. Date: Nov. 27, 2014

(65) Prior Publication Data
US 2016/0094108 A1 Mar. 31, 2016

(30) Foreign Application Priority Data

May 24, 2013 (FR) .................................... 13 54701

(51) Int. Cl.
*H02N 10/00* (2006.01)
*H02K 7/18* (2006.01)
(Continued)

(52) U.S. Cl.
CPC ........... *H02K 7/1892* (2013.01); *H02K 35/02* (2013.01); *H02K 99/10* (2016.11); *H02N 11/002* (2013.01);
(Continued)

(58) Field of Classification Search
CPC ...... H02K 35/02; H02K 7/1892; H01L 37/02; H02N 1/08
(Continued)

(56) References Cited

U.S. PATENT DOCUMENTS 4,234,813 A 11/1980 Iguchi et al.
7,732,974 B1 * 6/2010 Boland .................... H02N 1/08
310/309

(Continued)

FOREIGN PATENT DOCUMENTS

WO 2008/116792 A1 10/2008
WO 2011/110590 A1 9/2011
(Continued)

OTHER PUBLICATIONS

Wei-Tai Wu, et al., Temperature Dependence of Magnetic Properties of a Polymer Bonded Magnetic Material Power Electronics Systems and Applications, 2006, pp. 73-76, XP031072936.
(Continued)

*Primary Examiner* — Hanh Nguyen
(74) *Attorney, Agent, or Firm* — Oblon, McClelland, Maier & Neustadt, L.L.P.

(57) ABSTRACT

A device and method recovering heat energy and converting the heat energy into electrical energy by heat-sensitive molecules to which are connected magnetic particles, with the heat-sensitive molecules able to move the magnetic particles in relation to a conductive circuit to generate an induced current in the circuit.

15 Claims, 7 Drawing Sheets

(51) Int. Cl.
*H02N 11/00* (2006.01)
*H03K 17/96* (2006.01)
*H02K 35/02* (2006.01)
*H02K 99/00* (2014.01)
*H03K 17/97* (2006.01)

(52) U.S. Cl.
CPC ..... *H03K 17/96* (2013.01); *H03K 2017/9706* (2013.01); *H03K 2217/96035* (2013.01); *H03K 2217/96038* (2013.01)

(58) Field of Classification Search
USPC .................................. 310/306, 307, 308, 309
See application file for complete search history.

(56) References Cited

U.S. PATENT DOCUMENTS

| | | | |
|---|---|---|---|
| 7,745,962 B2* | 6/2010 | Morgenstein | H02K 44/08 165/104.32 |
| 7,804,134 B2 | 9/2010 | Coronel et al. | |
| 8,046,993 B2* | 11/2011 | Kao | F01K 25/06 310/11 |
| 2004/0182099 A1* | 9/2004 | Hsu | H01L 23/473 62/259.2 |
| 2008/0286153 A1 | 11/2008 | Lee et al. | |
| 2010/0109474 A1 | 5/2010 | Russberg et al. | |
| 2010/0190006 A1 | 7/2010 | Li et al. | |
| 2010/0289377 A1* | 11/2010 | Erbil | H01L 37/02 310/306 |
| 2011/0155478 A1 | 6/2011 | Choi et al. | |
| 2012/0019098 A1* | 1/2012 | Erbil | H01L 37/02 310/306 |
| 2013/0048045 A1 | 2/2013 | Bayer et al. | |
| 2013/0330471 A1 | 12/2013 | Dellea et al. | |
| 2014/0144486 A1 | 5/2014 | Krause et al. | |
| 2014/0147583 A1 | 5/2014 | Dellea et al. | |
| 2014/0158334 A1 | 6/2014 | Dellea et al. | |
| 2014/0356528 A1 | 12/2014 | Dellea et al. | |
| 2014/0374930 A1 | 12/2014 | Dellea et al. | |
| 2015/0010693 A1 | 1/2015 | Dellea et al. | |
| 2015/0044809 A1 | 2/2015 | Dellea et al. | |
| 2015/0084480 A1 | 3/2015 | Savelli et al. | |
| 2015/0115769 A1 | 4/2015 | Savelli et al. | |
| 2015/0153297 A1 | 6/2015 | Aliane et al. | |
| 2015/0217328 A1 | 8/2015 | Dellea et al. | |

FOREIGN PATENT DOCUMENTS

| | | |
|---|---|---|
| WO | 2011/144525 A2 | 11/2011 |
| WO | 2013/014511 A1 | 1/2013 |

OTHER PUBLICATIONS

Xiaowu Fan, et al., "Biomimetic Anchor for Surface-Initiated Polymerization from Metal Substrates," Journal of the American Chemical Society, vol. 127, No. 45, Oct. 22, 2005, pp. 15843-15847.

Jeffrey L. Dalsin, et al., "Mussel Adhesive Protein Mimetic Polymers for the Preparation of Nonfouling Surfaces," Journal of the American Chemical Society, vol. 125, No. 14, Mar. 15, 2003, pp. 4253-4258.

Jan Seuring, et al., "Polymers with Upper Critical Solution Temperature in Aqueous Solution," Macromolecular Rapid Communications, vol. 33, Sep. 7, 2012, pp. 1898-1920.

Vincent Mevellec, et al., "Grafting Polymers on Surfaces: A New Powerful and Versatile Diazonium Salt-Based One-Step Process in Aqueous Media," Chemistry of Materials, vol. 19, Nov. 8, 2007, pp. 6323-6330.

International Search Report Issued Jun. 25, 2014 in PCT/EP14/60574 Filed May 22, 2014.

French Search Report Issued Feb. 11, 2014 in FR 1354701 Filed May 24, 2013.

U.S. Appl. No. 14/803,429, filed Jul. 20, 2015, Abdelkader Aliane.

* cited by examiner

DEVICE FOR CONVERTING HEAT ENERGY INTO ELECTRICAL ENERGY WITH HEAT-SENSITIVE MOLECULES

TECHNICAL FIELD

This invention relates to the field of devices that make it possible to convert heat energy into electrical energy, and provides for the production of a system for converting heat energy into electrical energy by means of a movement of magnetic particles generated consecutively at a variation in temperature.

It relates in particular to the production of a system for recovering energy provided with such a device for converting heat energy into electrical energy.

PRIOR ART

In order to supply electronic devices or microsystems with power which still limiting the use of batteries, numerous types of systems for recovering energy have appeared.

Document "WO2011/144525 A2" discloses for example a device that makes it possible to convert mechanical energy into electrical energy, using a movable magnet actuated mechanically and which is arranged at the centre of a coil. When the magnet is moved, its movement makes it possible to generate a current in the coil.

Electronic circuits, during their operation, produce heat. This heat is generally not used and must be evacuated in order to not deteriorate the circuits. Other sources of heat for which the heat given off is not used are also present in our environment.

There is the problem of finding a new system for recovering heat energy wherein a conversion of heat energy into electrical energy would be implemented.

DISCLOSURE OF THE INVENTION

This invention first relates to a device for converting heat energy into electrical energy comprising: a support, a conductive circuit wherein an induced current is intended to flow, a set of magnetic particles connected to the support using means of attachment able to maintain the magnetic particles in at least one first position with respect to said conductive circuit when the device is subjected to a first temperature, the means of attachment being formed of attaching molecules of at least a first type, sensitive to the temperature, in such a way that when the attaching molecules of the first type are subjected to a given variation in the temperature from the first temperature to the second temperature, the means of attachment move the magnetic particles from the first position to a second position with respect to said conductive circuit, with the movement of the magnetic particles from the first position to the second position inducing a current in said conductive circuit.

As such the movement of the particles makes it possible to vary the magnetic field seen by the conductive circuit and to generate an electric current induced in this conductive circuit.

Magnetic particles means magnetised particles. These particles can be with a ferromagnetic material base. The magnetisation of the ferromagnetic material can be natural or have been conferred for example by an electro-magnet.

The attaching molecules can be in particular molecules of polymer(s) sensitive to the temperature also called heat-sensitive polymers.

The attaching molecules of the first type can be molecules having a characteristic transition temperature LCST1 located between said first temperature and said second temperature and be adapted, when they are subjected to said given variation in the temperature, to pass from a first configuration to a second configuration.

This change in configuration is more preferably reversible in such a way that the heat-sensitive attaching molecules are further configured so that when they are subjected to an inverse variation in the temperature i.e., between the second temperature and the first temperature, they pass from said second configuration to said first configuration.

The heat-sensitive attaching molecules can as such be provided in such a way that, when they are subjected to a variation in temperature from the second temperature to the first temperature, the means of attachment move the magnetic particles from the second position to the first position with respect to said conductive circuit.

The attaching molecules of the first type can be such that in the first configuration they have a given affinity for water, while in the second configuration, the attaching molecules have an affinity for water that is the inverse of said given affinity.

As such, when for example, in the first configuration the attaching molecules are hydrophilic, in the second configuration the attaching molecules are hydrophobic.

Advantageously, the means of attachment further comprise attaching molecules of at least a second type.

The attaching molecules of the second type can also be sensitive to the temperature. The attaching molecules of the second type can also be molecules of polymer(s).

The magnetic particles can be as such connected to a first zone of the support by means of attaching molecules of the first type and to a second zone of the support by means of attaching molecules of the second type.

According to a first embodiment, the attaching molecules of the second type can be molecules that have a characteristic transition temperature located between a third temperature and a fourth temperature, the attaching molecules of the second type being configured furthermore in such a way that when they are subjected to a variation in temperature from the third temperature to the fourth temperature the attaching molecules of the second type change affinity for water.

According to this first possibility, a conversion of heat energy into electrical energy can be carried out over several ranges of temperatures.

According to a second possibility of implementation, the attaching molecules of the first type can have a given affinity for water at the first temperature, while the attaching molecules of the second type have another affinity for water, inverse of said given affinity at the first temperature, the attaching molecules of the second type having a given affinity for water at a second temperature, the attaching molecules of the first type having an affinity for water that is the inverse of said given affinity at said second temperature.

According to this second possibility, a conversion of heat energy into electrical energy can be carried out over several ranges of temperatures.

In this case, if for example at the first temperature the attaching molecules of the first type are hydrophilic, while the attaching molecules of the second type are hydrophobic, at the second temperature the attaching molecules of the first type are hydrophobic, the attaching molecules of the second type being at the same time hydrophilic.

More generally, the attaching molecules can be such that they are able to pass from a solvophilic nature to a solvophobic nature following a variation in temperature.

Advantageously, the attaching molecules can be polymer molecules sensitive to the temperature chosen from one or several of the following polymers: PolyNipam, Polyvinylcaprolactame, Hydroxypropylcellulose, Polyoxazoline, Polyvinylmethylether, Polyethyleneglycol.

The magnetic particles can be connected to a first zone of the support by means of attaching molecules and to a second zone of the support by means of other attaching molecules, the conductive circuit being arranged on the support in such a way as to form a conductive winding about an axis passing through said first zone and said second zone of the support, and forming a non-zero angle, in particular orthogonal, in relation to a main plane of the support.

Advantageously the magnetic particles are formed of a body with a magnetic material base coated with an adhesive layer linked to said attaching molecules.

According to a possibility of implementation, the support can be a substrate with a polymer material base. The support can be also provided with a material base and according to a thickness that makes it flexible.

This invention also provides a system for recovering energy comprising a device for converting heat energy into electrical energy such as defined hereinabove, as well as means for applying a variable heat flow to said device for converting heat energy into electrical energy.

This invention also provides a method for carrying out a device for converting heat energy into electrical energy such as defined hereinabove, wherein the attaching molecules have a polymer base sensitive to the temperature, with the method comprising at least one step of grafting magnetic particles to said molecules of polymer.

According to a possibility of implementation, the method can further include the formation in the first substrate of at least one first cavity and of at least one second cavity around the first cavity, said attaching molecules being fixed in the second cavity, with the conductive circuit being formed in the second cavity.

The method can comprise the steps of:
fastening of a first set of attaching polymer molecules onto the first substrate,
fastening of a second set of attaching polymer molecules onto a second substrate, then assembly of the first substrate and of the second substrate.

BRIEF DESCRIPTION OF THE DRAWINGS

This invention shall be better understood when reading the description of embodiments provided, purely for the purposes of information and in no way restrictive, in reference to the annexed drawings wherein.

Identical, similar or equivalent parts of the various figures carry the same numerical references in such a way as to facilitate passing from one figure to the other.

The various parts shown in the figures are not shown necessarily according to a uniform scale, in order to make the figures more legible.

DETAILED DISCLOSURE OF PARTICULAR EMBODIMENTS

An example of a device for converting heat energy into electrical energy, such as implemented according to the invention, shall now be described in liaison with FIGS. 1A-1D.

Figure 1A:
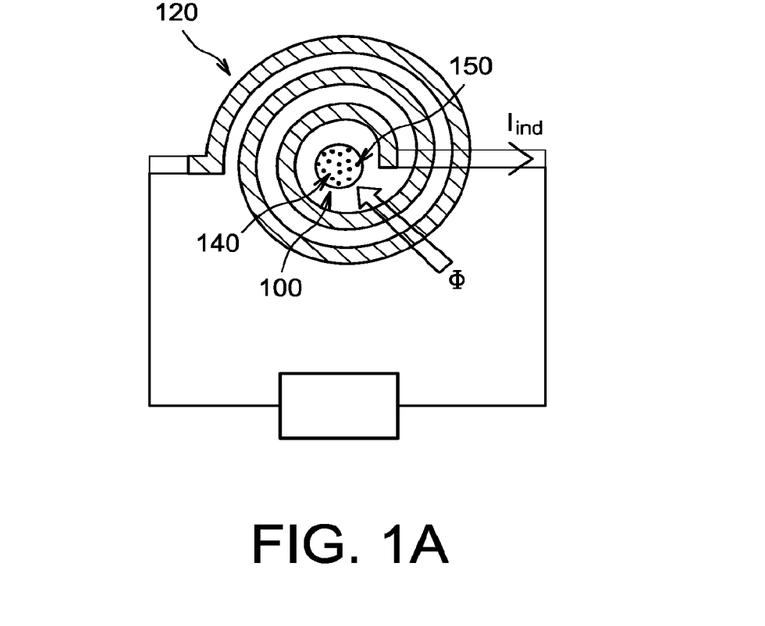
FIGS. 1A, 1B, 1C, 1D show an example of a device for converting heat energy into electrical energy such as implemented according to the invention.

FIG. 1A shows a general operating principle of such a device provided with a support 100, intended to be subjected to a heat flow $\phi$, and whereon magnetic particles 150 are arranged.

The device also comprises a conductive circuit 120, which can be in the form of a winding, for example as a spiral, arranged around the magnetic particles 150. The magnetic particles 150 are magnetised and have a material base, in particular ferromagnetic, having a natural magnetisation or having a magnetisation generated by means of an electro-magnet.

The magnetic particles 150 are attached or connected to the support 100 using means of attachment 140 sensitive to the temperature, themselves attached or connected to the support 100 and provided to move the particles 150 in relation to the conductive circuit 120, according to a variation in the temperature to which these means of attachment 140 are subjected.

The operating principle of the conversion is based in particular on the Faraday/Lenz law: rot $E = -dB/dt$ with E: the electric field, B: the magnetic field and t: the time.

A variation in the temperature acting on the means of attachment 140 is able to trigger a movement of magnetic particles (magnet) in relation to the support 100 and to the conductive circuit 120, with this movement making it possible to vary the magnetic field seen by the conductive circuit 120 and to generate an electric current induced in this conductive circuit 120. The origin of this electric current is an electric field which is orthogonal to said magnetic field.

As such, the device makes it possible to produce an induced current using the movement of the magnetic particles 150 magnetised with respect to the conductive winding 120, this movement being itself triggered by the means of attachment 140 reacting to a variation in temperature of a heat flow $\phi$ that has been recovered.

The heat flow $\phi$ that is recovered can come from a source of light radiation, for example a laser source.

In the device according to the invention, the means of attachment 140 of the magnetic particles 150 are molecules, referred to as heat-sensitive or also called heat-stimulables, i.e. temperature sensitive molecules of which the configuration is able to be modified, by a variation in the temperature above and/or below a characteristic temperature of these molecules, and this without a change in the state of the molecules, and while still retaining the chemical elements that comprise the molecules. The change in configuration of the molecules following a change in temperature is such that their volume as well as some of their properties are modified.

The change in configuration of the attaching molecules of the device is more preferably reversible when they are subjected to an inverse variation in the temperature.

The molecules can for example have a solvophilic/solvophobic nature that varies according to the temperature.

The attaching molecules 140 can be molecules that have an affinity for the molecules of water that varies according to the temperature, and which are configured to be able to pass for example from a hydrophilic state to a hydrophobic state when they are subjected to a given variation in the temperature. The molecules 140 are more preferably chosen in such a way that this change in affinity for water can be reversed, with the molecules 140 then being able to pass from a hydrophobic state to a hydrophilic state when they are subjected to an inverse variation in the temperature. The attaching molecules 140 can be in particular molecules with a molecular weight exceeding 200 so that the change in affinity allows for a change in the arrangement, for example a significant variation in the wetting angle.

The attaching molecules 140 can be in particular activatable molecules of polymers that can be subjected to a modification of their physical properties under the action of a variation in temperature that exceeds or that passes below a threshold temperature, characteristic of these molecules, called LCST transition (LCST for "lower critical solution temperature").

The attaching molecules 140 of the magnetic particles 150 can be for example heat-sensitive polymer or heat-activatable molecules of the poly(N-isopropylacrylamide) or PNIPAM type. Such a polymer is subjected to a reversible macromolecular transition, from a hydrophilic state to a hydrophobic state, around its lower critical solution temperature LCST. This transition is rapid and located between 30° C. and 37° C.

As such, when the attaching molecules 140 are for example with a PNIPAM base and subjected to a first temperature $T_1$, located under the transition temperature LCST, they have a hydrophilic and soluble nature in water.

When the attaching molecules 140 with a PNIPAM base are subjected to a second temperature $T_2 > T_1$ and located above their transition temperature, they have a hydrophobic and insoluble nature in water.

Other types of activatable polymers can be used according to the targeted temperature range, for example Polyvinylcaprolactame (having an LCST≈37° C.), Hydroxypropylcellulose (having an LCST between 40° C. and 56° C.), Polyoxazoline (having an LCST of about 70° C.), Polyvinylmethylether (having an LCST of about 45° C.), Polyethyleneglycol (having an LCST between 100° C. and 130° C.).

According to a possibility of implementation, the means of attachment 140 of the magnetic particles 150 can be formed of several types of heat-sensitive or heat activatable polymers, with respective separate transition temperatures LCST, and this in such a way as to be able to cover various ranges of temperature, i.e. to be able to put into movement the magnetic particles 150 for variations in temperature according to difference ranges of temperature and optionally separate.

Figure 1B:
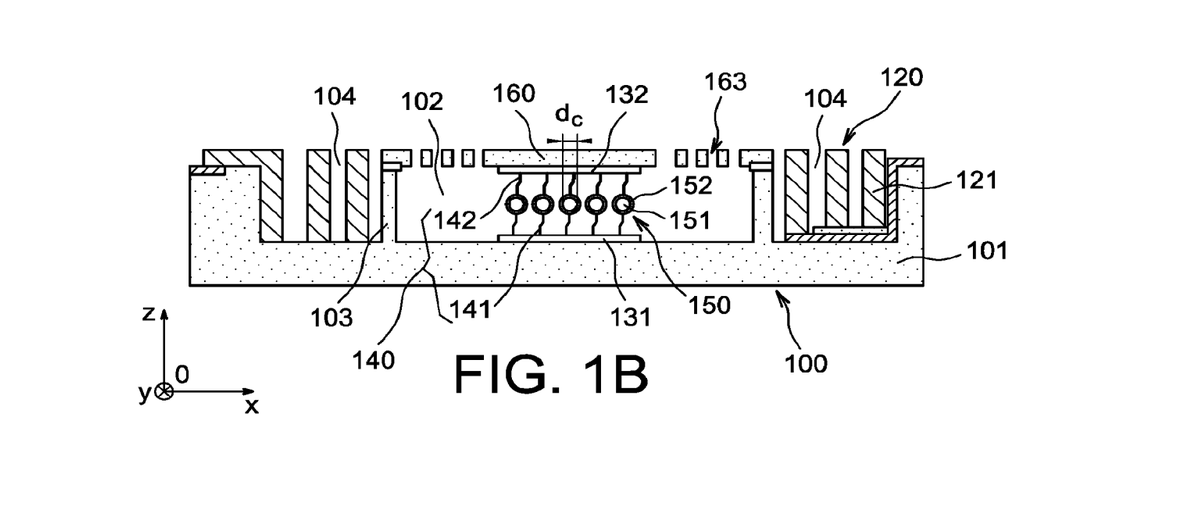

FIG. 1B shows a particular detailed embodiment wherein the support 100 of the particles 150 is in the form of a flexible substrate 101 and with a polymer material base, for example PEN (Polyethylene naphtalate), or PET (Polyethylene terephthalate), or PI (Polyimide), whereon the conductive circuit 120 is also arranged.

The substrate 101 comprises a central cavity 102 wherein the magnetic particles 150 and the attaching molecules 140 are arranged, as well as a peripheral cavity 104, arranged around the central cavity 102, and wherein the conductive circuit 120 is housed. The conductive circuit 120 is in this example formed from a set of conductive tracks 121 winding around the central cavity 102 wherein are located the magnetic particles 150.

These magnetic particles 150 can be formed of a body 151 with a magnetic material base, in particular ferromagnetic such as for example Nickel, Boron Iron Neodymium ($Nd_2Fe_{14}B$), Samarium Cobalt ($SmCo_5$), a Nickel and Cobalt (NiCo) alloy, a material with a Strontium and ferrite base such as $SrFe_{12}O_{19}$, or with a Barium and ferrite base such as $BaFe_{12}O_{19}$. The body 151 is coated with a layer 152 of adhesive of the particles with the attaching molecules. The layer 152 can also have a role of protection against oxidation. This adhesive layer 152 can be for example with a $SiO_2$ base in order to make it possible to facilitate the adhesion with molecules of heat-sensitive polymer such as PNIPAM, themselves fastened or connected to the substrate 101.

The particles 150 can have a critical diameter or dimension for example of about 50 nm.

The body 151 can have a critical diameter or dimension for example between 10 nm and 40 nm, while the layer 152 can have a thickness between 40 nm and 10 nm.

The magnetic particles 150 are in this example intended to be moved in one direction, forming a non-zero angle in relation to the main plane of the substrate 101 in particular orthogonal or substantially orthogonal to the main plane of the substrate 101 (with the main plane of the substrate being defined as a plane passing through the latter and parallel to the plane [O; x; y] in FIG. 1B). The advantage of having a movement of particles according to the axis z makes it possible in this example to maximise the electric field E and therefore the current generated in the conductive circuit 120.

The magnetic particles 150 are connected, for example by grafting, to different types of polymer attaching molecules 141, 142 sensitive to the temperature, these attaching molecules 141, 142 being, themselves fastened or connected to the substrate 101, for example by grafting.

The magnetic particles 150 are, in this example, connected to a first zone 131 of the support by means of heat-sensitive polymer molecules 141 of a first type, that have a characteristic transition temperature LCST1 that can be for example between 20° C. and 50° C. As such, when the temperature increases and exceeds the characteristic transition temperature LCST1, the heat-stimulable molecules 141 of the first type can for example become hydrophobic and be subjected to a change in volume.

It is possible to modify the characteristic transition temperature LCST of the heat-sensitive polymers by adding a salt to them (in order to reduce their characteristic transition temperature LCST) or by adding a surfactant or a suitable polymer (in order to increase their characteristic transition temperature LCST).

In the same way, a modification in the temperature LCST for a family of heat-stimulable polymer can be carried out by the formation of a copolymer, with the copolymer bearing the choice of a load or an amphiphilic group.

In this embodiment, the magnetic particles 150 are also connected to a second zone 132 of the support by means of heat-sensitive polymer molecules 142 of a second type.

According to a possibility of implementation, the attaching molecules 142 of the second type can have a characteristic transition temperature LCST2 different from that LCST1 of the attaching molecules of the first type, and such that LCST2 is located between a third temperature T3 (different from T1 and T2) and a fourth temperature T4.

The attaching molecules 142 of the second type can then be configured in such a way that when they are subjected to a variation in temperature from the third temperature to the fourth temperature, their affinity for water is modified by passing for example from a hydrophilic nature to a hydrophobic nature or inversely.

Alternatively, the heat-sensitive attaching molecules 142 of the second type have an affinity for water which varies according to the temperature in a way inversely to that of the heat-sensitive attaching molecules 141 of the first type.

In this particular embodiment, at a given temperature, when molecules 142 of the second type are hydrophobic, the molecules 141 of the first type are at the same time hydrophilic, while at another temperature, when molecules of the second type 142 are hydrophilic, the molecules of the first type 141 are hydrophobic.

Such an embodiment can be obtained for example when the heat-sensitive attaching molecules 141 of the first type are PNIPAM molecules having a characteristic transition temperature LCST1 located for example in a range of temperatures between 20° C. and 50° C.

The heat-sensitive attaching molecules 142 of the second type can be molecules that have a characteristic temperature UCST2 (UCST for "upper critical solution temperature") in a range of temperatures between 20° C. and 50° C. The attaching molecules 142 can be for example of the hydrogel type and pass from a hydrophobic nature to a hydrophilic nature above a temperature exceeding UCST2. The attaching molecules 142 can be for example with a PDMAPS base (poly-3-dimethyl(methacryloyloxyethyl) ammonium propane sulphonate) having for example an UCST between 32° C. and 35° C. or with a poly(propylsulfonatedimethylammoniumethylmethacrylate) base of which the UCST is about 30° C.

More generally, the attaching molecules 141, 142 can have a solvophilic/solvophobic nature that varies according to the temperature.

A variation in the temperature on the device induces a mechanical movement of the heat-stimulable polymer molecules 141 and/or 142 driving the movement of the magnetic particles 150 which are grafted onto the heat-stimulable molecules 141, 142. The density of the current flowing in the circuit is proportional to the movement of the magnetic particles 150.

In this embodiment, the first zone 131 whereon the heat-sensitive polymer molecules 141 are grafted is located at the bottom of the central cavity 102, while the second zone 132 whereon the heat-sensitive polymer molecules 142 are grafted, is arranged facing the first zone 131, on a portion of the support that forms a cover 160 for the central cavity 102. As such a vertical oscillating movement can as such be implemented.

The cover 160 covering the central cavity 102 can comprise openings 163 in order to allow a fluid to penetrate into, and to exit from, the central cavity 102. The openings 163 can in particular allow moisture to penetrate into the cavity 102.

When the molecules 141, 142 sensitive to the temperature have a variation in affinity to the molecule of water according to the temperature, it may be important to allow for a good supply of moisture in the central cavity 102. In order to improve this supply of moisture, the water or the moisture can be confined in the cavity 102 by providing on the internal walls of this cavity one or several zones having a good affinity with the water as for example polyimide (PI), Polydimethylsiloxane (PDMS), or even be depositing a polar SAM layer (self-assembled single layer) such as for example a layer of 2,2-(Ethylenedioxy) diethanethiol, Hexa (ethylene glycol) dithiol, Tetra(ethylene glycol) dithiol, (11-Mercaptoundecyl)tetra(ethylene glycol), (11-Mercaptoundecyl)hexa(ethylene glycol), Triethylene glycol mono-11-mercaptoundecyl ether.

This or these SAM layers can be formed on a metal zone for example such as gold (Au), and/or silver (Ag), and/or Copper (Cu).

Figure 1C:
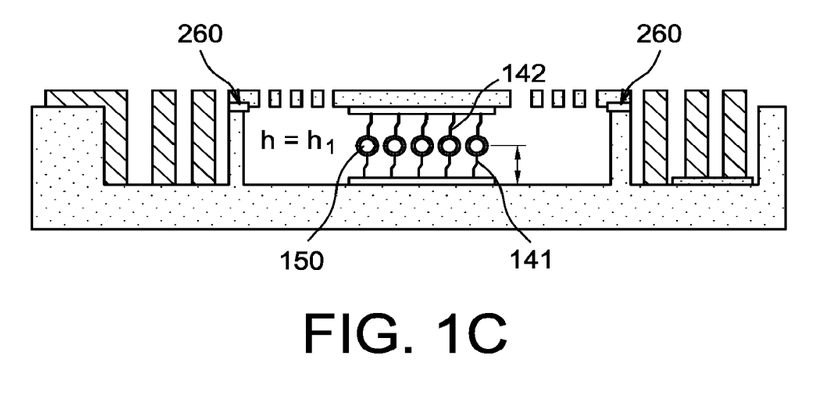
Figure 1D:
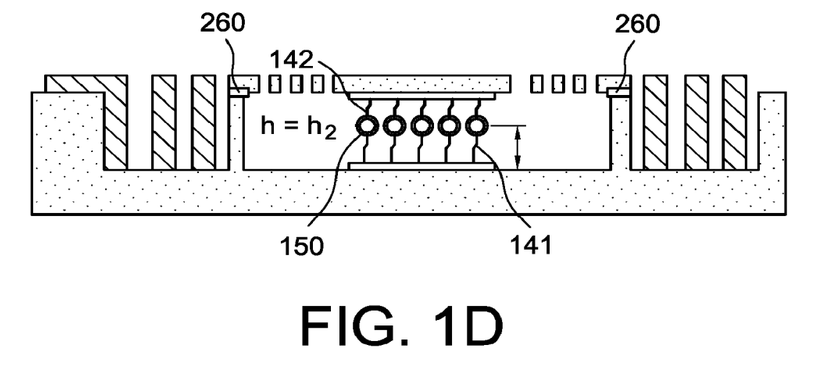

In FIGS. 1C-1D, a movement of particles 150 within a device for conversion of the type of that described hereinabove is shown.

The magnetic particles 150 are firstly maintained by the molecules 141, 142 in a first position with respect to said conductive circuit 120 when the device is subjected to a first temperature T1<LCST1 (with LCST1 the transition temperature of the molecules of the first type). In this first position the particles 150 are located at a height $h_1$ (measured in the direction z in FIG. 1C) for example of about 500 nm, in relation to substrate 101.

A variation in the temperature from the first temperature to a second temperature exceeding the temperature, drives a displacement of the attaching molecules which move the magnetic particles 150 from the first position to a second position with respect to said conductive circuit 120.

This displacement of magnetic particles from the first position to the second position induces a current in said conductive circuit 120. In this second position, the particles 150 are located at a height $h_2$ for example of about 1 μm, in relation to substrate 101.

According to another embodiment, the attaching molecules 140 sensitive to the temperature and the magnetic particles 150 which are grafted to them can be arranged, directly of the conductive tracks of a conductive circuit, the conductive circuit playing in this case the role of support.

An example of a method for carrying out a device for converting heat energy into electrical energy, according to the invention, shall now be described in liaison with FIGS. 2A-2F, 3A-3C and 4A-4B.

The starting material is a substrate 101, which can be flexible and with a polymer material base such as for example PEN (Polyethylene naphthalate), or PET (Polyethylene terephthalate), or PI (Polyimide). The substrate 101 can have a thickness (measured in a direction orthogonal to the plane [0,x,y] of the orthogonal marking [0,x,y,z] in FIG. 2A) comprise for example entre 25 μm and 125 μm.

Figure 2A:
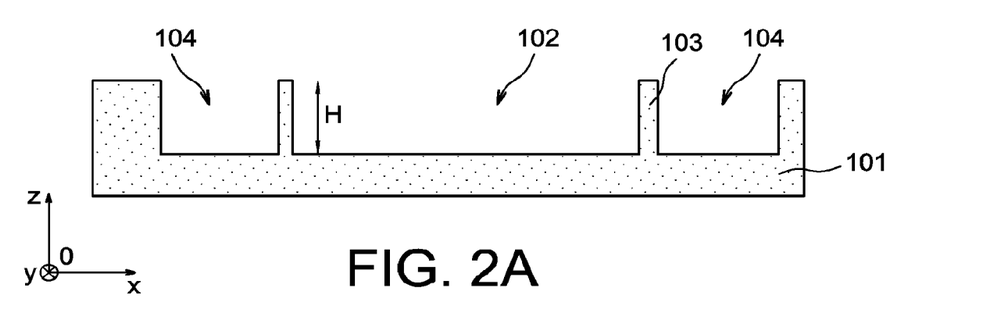
FIGS. 2A-2F, 3A-3C and 4A-4B show an example of a method for carrying out a device for converting heat energy into electrical energy according to the invention.

In the substrate 101, first of all are carried out cavities 102, 104, of which a central cavity 102 and a peripheral cavity 104 arranged around the central cavity 102.

The cavities 102, 104 can be formed for example by an etching, which can be carried out by a means of a laser or using a plasma for example with an ($O_2$+$SF_6$) base or of the wet type using for example a solution of the methylbenzoatetype.

The central cavity 102 and the peripheral cavity 104 can be separated by walls 103 formed by the etching of the substrate 101.

The height H of the cavities 102, 104 (measured in a direction orthogonal to the plane [0,x,y] of the orthogonal mark [0,x,y,z] in FIG. 2A) can be for example between 1 μm and 5 μm.

Then (FIG. 2B), conductive zones 105a, 105b for resuming contact are formed on certain localised regions of the substrate 101, in particular located in the peripheral cavity 104.

Figure 2B:
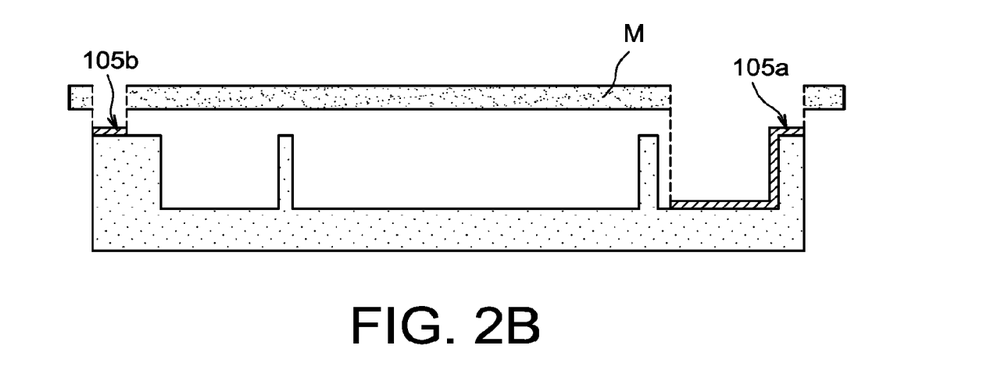

For this, through a mask M, a deposit of conductive material can be carried out, for example by cathode sputtering. The material deposited can be a metal, for example stainless such as gold and have a thickness between for example 30 nm and 300 nm.

Then (FIG. 2C), on a given conductive zone 105b among the conductive zones 105a, 105b for resuming contact, at least one insulating zone 107 is formed by depositing a dialectic material, for example via screen printing or by ink jet.

Figure 2C:
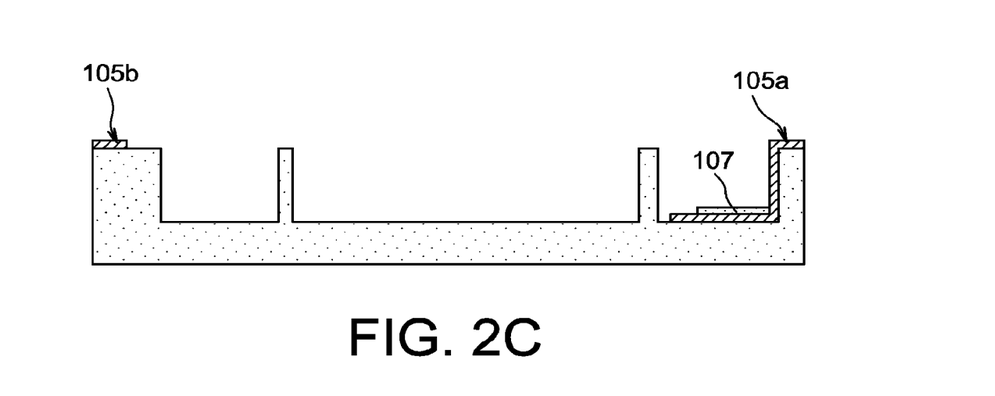

The dialectic material can be chosen so as to have a low dielectric constant and can be for example polyimide or a fluorinated polymer with a thickness between for example 100 nm and 1 µm. This deposit can be followed by an annealing of a duration for example between 10 minutes and 20 minutes at a temperature for example of about 100° C.

Figure 2D:
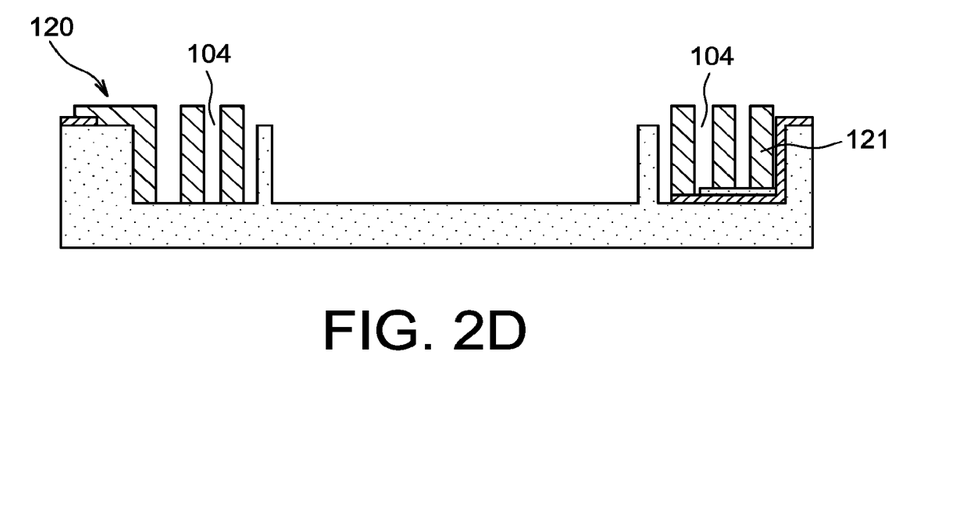
Figure 2E:
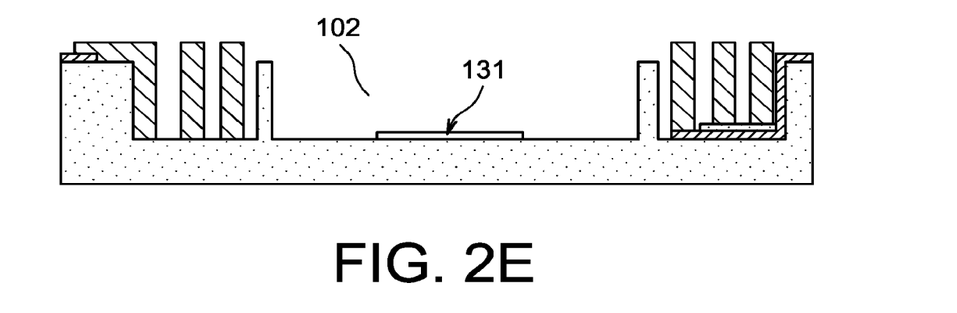

A conductive circuit 120 is then formed in the peripheral cavity 104 (FIG. 2D). This circuit 120 can be in the form of a sub-form of a conductive winding carried out by depositing a metal layer, for example with a Ag, or Au, or Cu, according to a technique which can be for example PVD (physical vapour deposition) through a mask or be screen printing, or via a technique of the inkjet type.

The thickness of the metal layer deposited can be between for example 100 nm and 5 µm.

An etching can be then carried out in order to define conductive tracks 121 for the conductive circuit 120. This conductive circuit 120 comprises an end arranged on the conductive zone 105a while another end is in contact with another conductive zone 105b, with the rest of the winding being arranged either on the substrate 100 or on the insulating zone 107.

Then (FIG. 2E), in the central cavity 102, a first fastening zone 131 is formed on the substrate 100 whereon means of attachment of magnetic particles are intended to be arranged later. This zone 131 can be for example with a copper oxide base formed by deposit by screen printing, or by ink jet. The deposit is carried out according to a thickness between for example 100 nm and 1 µm at the bottom of the central cavity 104. Alternatively, a fastening zone can be provided with a copper base formed by the deposit of copper oxide followed by a deoxidation annealing carried out for example using pulses of UV radiation.

Then (FIG. 2F), a grafting is carried out of a first set of heat-stimulable or heat-sensitive molecules 141 of a first type, for example heat-sensitive polymers, onto a fastening zone 131.

Figure 2F:
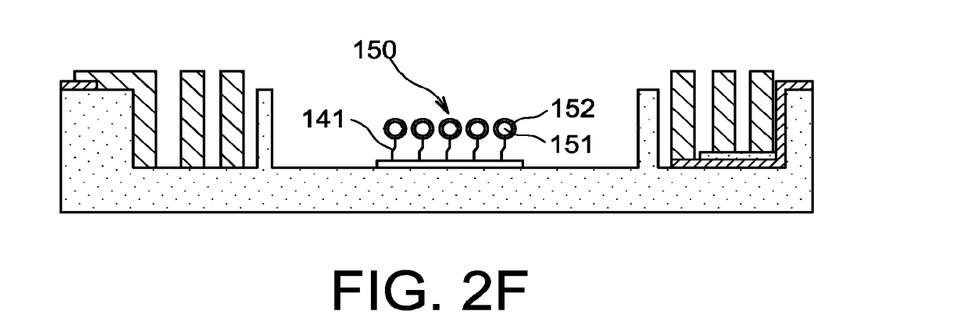

The grafted molecules 141 can already be provided at one of their ends with magnetic particles 150, formed from a body 151 with a magnetised ferromagnetic material base such as for example Ni or $Nd_2Fe_{14}B$, or $SmCo_5$, or NiCo, or $SrFe_{12}O_{19}$, or $BaFe_{12}O_{19}$ and coated with an adhesive layer 152 which can also play the role of a protective layer and be for example $SiO_2$ based. The temperature at which the step of fastening or of grafting molecules 141 is carried out can depend on their transition temperature LCST1. The magnetic particles 150 can have been grafted beforehand on the molecules 141, using a solvent that favours the grafting, for example dichloromethane. The magnetic particles can have a natural magnetisation or have been magnetised by means of an electro-magnet.

The heat-sensitive or heat stimulable molecules 141 of the first type can be for example PNIPAM molecules having an affinity for water that varies in a range of temperature, for example between 20° C. to 50° C., and passing from a hydrophilic nature to a hydrophobic nature when it is subjected to a temperature ranging beyond their transition temperature LCST1.

Figure 3A:
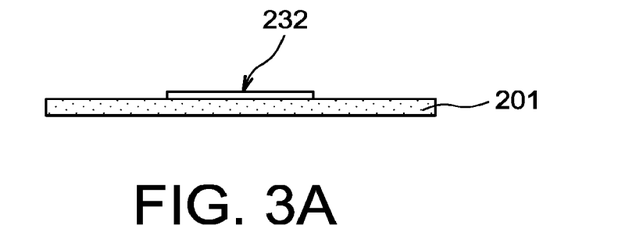

The method also comprises, beforehand, or simultaneously, or after carrying out the steps that have just been described with FIGS. 2A-2F, the carrying out on another substrate 201, for example a polymer substrate with a PEN base, or with a PET base, or with a PI base, of a thickness between for example 25 µm and 50 µm, of a second fastening zone 232 whereon attaching molecules of magnetic particles are intended to be arranged later (FIG. 3A).

The fastening zone 232 can be for example with a copper oxide CuO base and have a thickness between for example 100 nm and 1 µm. According to another example, the fastening zone 232 can be a copper zone obtained by the reducing of a layer of copper oxide (FIG. 3A).

Figure 3B:
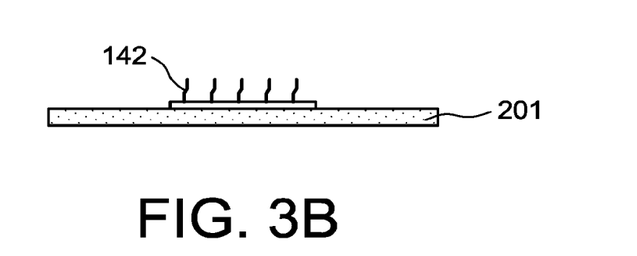

A grafting is carried out on the second substrate 201 on the second fastening zone 232 of a set of heat-sensitive or heat stimulable molecules 142 (FIG. 3B). The heat-sensitive or heat stimulable molecules 142 grafted on the second substrate 201 are of a second type, different from that of the molecules grafted onto the first substrate 101.

The heat-sensitive or heat stimulable molecules 142 of the second type can be polymers sensitive to the temperature and that have a transition temperature LCST2.

The heat-sensitive or heat stimulable molecules 142 of the second type can have an affinity for water that varies in a range of temperature, for example between 20° C. to 50° C., and which, in this range varies in a manner inversely of that or opposite that of the heat-sensitive or heat stimulable molecules 141 of the first type. For example, the PDMAPS (poly-3-dimethyl(methacryloyloxyethyl) ammonium propane sulphonate has a characteristic transition temperature UCST=32° C.

According to another possibility of implementation, the heat-sensitive or heat stimulable molecules 142 of the second type can have an affinity for the molecules of water that varies in a range of temperature which is different from that wherein the affinity for the molecules of water of the heat-sensitive or heat stimulable molecules 141 of the first type vary.

Figure 3C:
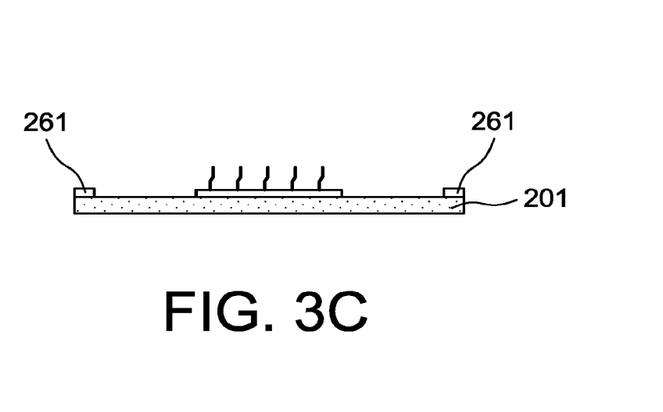

Then, one or several adhesive zones 260 are formed in order to allow for an assembly with the first substrate 101 and the second substrate 201.

Adhesive zones 260 can be in particular be carried out on the second substrate 201, for example in a peripheral region of the latter (FIG. 3C).

The adhesive zones 260 can be for example formed by printing by screen printing or through the manual dispensing of a layer, for example of the epoxy type, which is not conductive or of the NCP type (NCP for "Non Conductive Paste"). Alternatively, the adhesive zones 260 can be carried out using a SAM layer (SAM for "Self-Assembled Monolayer") of the isocyanate type and comprising ethyl, amine or benzyl groups.

Such a SAM layer can make it possible to ensure a gluing between the two substrates 101 and 201, in particular when these substrates 101, 201 have a PEN or a PET base. This SAM layer can be deposited on the PEN or PET material of the second substrate 201 after having carried out a treatment beforehand using a plasma $UV/O_3$ (ultraviolet/Ozone) of several minutes over a peripheral region of the substrate 201. During this treatment, the zones whereon heat-stimulable molecules have been placed, and in particular the fastening zone 231, can be masked in order to prevent them from being damaged.

Figure 4A:
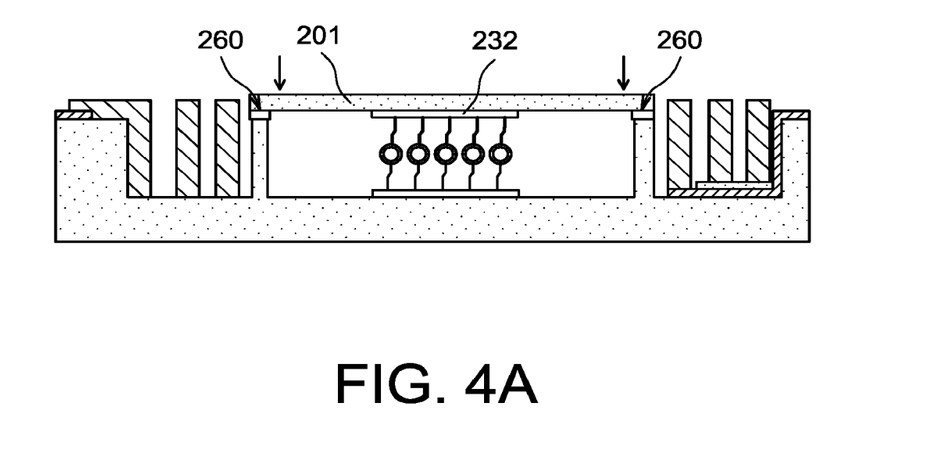

A transfer of the second substrate 200 is then carried out onto the first substrate 100 (FIG. 4A). This transfer can be carried out by gluing by using the alignment marks provided on the substrates 101, 201.

The gluing of the two substrates 101, 201 can be carried out by applying the adhesive zones 260, formed for example of epoxy glue (NCP) or of the SAM layer (self-assembled monolayer) on the top of the walls 103 that separate the cavities 102, 104.

This step of gluing can be followed by an annealing at 100° C. for about ten minutes in order to solidify the layer of glue or create bonds between the two substrates 101, 201.

The second substrate 201 can make it possible to form a cover for closing the central cavity 102.

Openings 163 (FIG. 4B) can be then made in the second substrate 201 forming a cover, for example using a laser.

Figure 4B:
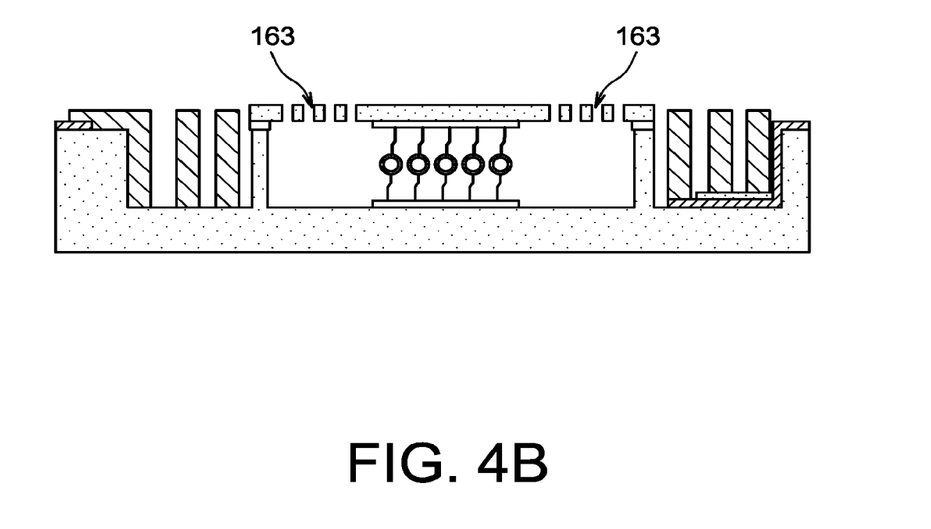

These openings 163 allow for an exchange of fluids between the outside of the device and the inside of the central cavity 102, and in particular allow moisture to penetrate into the central cavity 102.

In the method which has just been described, the steps of grafting attaching molecules onto the support shown respectively in FIG. 2F and in FIG. 3B can be carried out by means of a silane coupling agent carrying an isocyanate group.

An example reaction is given here with a polyethylene glycol (PEG) isocyanate. Such a reaction can take place in anhydrous dichloromethane:

A urethane covalent bond is as such formed.

For the grafting, other silane coupling agents carrying an isocyanate function can be used:

$OCN(CH_2)_3Si(OMe)_3$, $OCN(CH_2)_3SiMe_2Cl$;

The substrate 101 or 201 whereon is carried out the grafting can be tempered in an anhydrous solution of $H(OCH_2CH_2)_nOCONH(CH_2)_3Si(OEt)_3$ and of $CH_2Cl_2$.

Figure 5A:
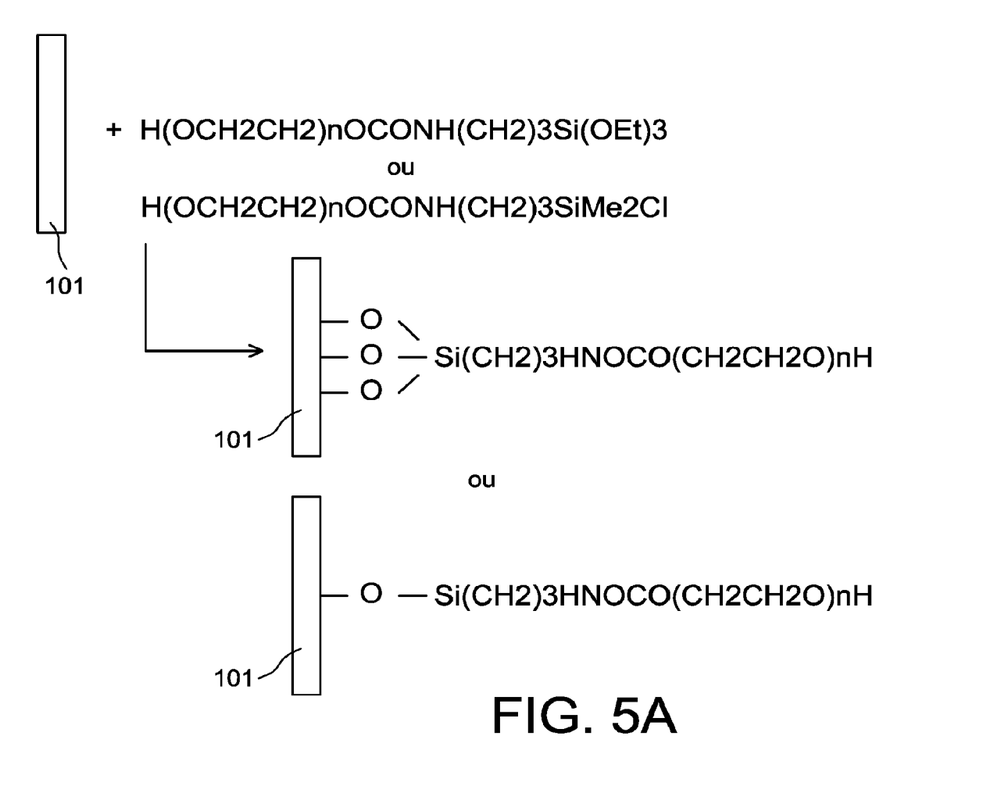
FIGS. 5A-5B show reactions of grafting polymer particles on a substrate able to be implemented during the manufacture of a device according to the invention.

FIG. 5A shows two types of reactions leading to the formation of molecules grafted on a substrate 101.

A hydrolysis first takes place with the atmospheric water first at ambient temperature. Then a heat treatment can be carried out.

This type of grafting is not necessarily limited to a polymer substrate but can be implemented on other types of substrates, for example metal and oxide based.

In order to allow for a grafting, the functions of interest presents on the heat-sensitive polymer can be:

- an alcohol in order to form a urethane (PEG, polyvinylmethylether, hydroxypropylcellulose);
- a carboxylic acid in order to form an amide (PolyNipam, hydroxypropylcellulose);
- an amine in order to form a urea (polyvinylmethylether, PEG).

Other modes of grafting are possible:

The surface of the substrate 101 can be modified and cause the heat-stimulable polymer to react carrying a reactive function on the surface (which can be the surface of a nano-particle).

Figure 5B:
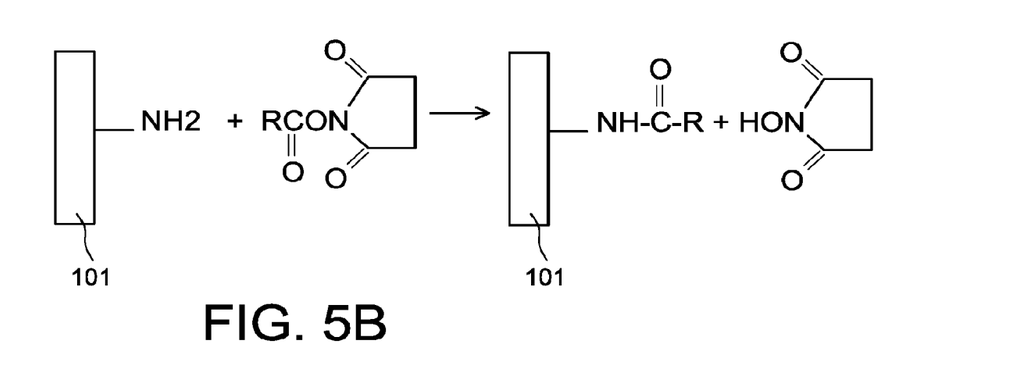

FIG. 5B shows another example of grafting wherein the reaction of a bis-catechol of alanine on a substrate 101 leads to the formation of a catecholate, the $NH_2$ of the amino acid function of the alanine remains free to react with a heat-sensitive polymer chain carrying a reactive group. Preferably, this reactive group is a succinimidyl ester group.

Such a type of grafting is described for example in the document "Biometric Anchor for Surface-Initiated Polymerization from Metal Substrates", Messersmith et al., J. AM. CHEM. SOC. 2005.

The table below shows a reactivity of esters carrying a PEG group.

| PEG NHS Ester | Ester (Symbol) | Half-life (minutes) |
|---|---|---|
| PEG-O—$CH_2CH_2CH_2CH_2$—$CO_2$—NHS | Succinimidyl Valerate (SVA) | 33.6 |
| PEG-O—$CO_2$—NHS | Succinimidyl Carbonate (SC) | 20.4 |
| PEG-$O_2$C—$CH_2CH_2CH_2$—$CO_2$—NHS | Succinimidyl Glutarate (SG) | 17.6 |
| PEG-$O_2$C—$CH_2CH_2$—$CO_2$—NHS | Succinimidyl Succinate (SS) | 9.8 |
| PEG-O—$CH_2$—$CO_2$—NHS | Succinimidyl Carboxymethyl (SCM) | 0.75 |
| PEG-O—$CH_2CH_2$—$CO_2$—NHS | Succinimidyl Propionate (SPA) | 16.5 |

The following table shows the reactivity of a type of a particular succinimidyl ester by varying the conditions of hydrolysis.

| PEG-O—$CH_2CH_2CH_2CH_2$—$CO_2$—NHS | Succinimidyl Valerate (SVA) | pH | Temp | Half-life |
|---|---|---|---|---|
| | | 8.0 | 25° C. | 33.6 minutes |
| | | 8.5 | 25° C. | 9.8 minutes |
| | | 9.0 | 25° C. | 3.1 minutes |
| | | 10.0 | 25° C. | ~56 seconds |

This table shows the reactivity of different PEG agents measured by hydrolysis at a pH 8, 25° C., and measured by the UV absorbance of the succinimidyl hydrolysed group (NHS).

If the surface of the substrate whereon the graft is carried out carries $NH_2$ amino pendant groups, more preferably primary, the succinimidyl PEG esters could also react. These primary amino groups can be obtained by hydrolysis of silane coupling agents such that:

With n=3 to 6, R1=Me, Et, x=0 to 2, Y=Cl or OR where R=Me or Et.

Another mode of grafting uses the method called "diazonium-induced anchoring process" (DIAP). This type of grafting is described for example in the document of Mévellec et al. "Grafting Polymers on Surfaces: A new powerful and Versatile Diazonium Salt Based One-Step Process in Aqueous Media", Chem. Mater. 2007, 19, 6323-6330.

An aryl diazonium salt is grafted on top of the surface of the substrate by leaving an aniline group neutralised by HCl, with the latter able to be reactivated as a primary amine by adding a base. We then return in the cases of grafting described hereinabove where the surface is covered with primary amino groups.

An example of a particular application of a device according to the invention can be that of a tactile device, for example a keyboard, provided with keys actuated by means of a detection of a variation in temperature due to the presence of a finger.

The finger plays as such, in this example, the role of a source of heat energy for activating heat-sensitive molecules which when they change configuration make it possible to move magnetic particles, with this displacement inducing a current in a conductive circuit. This current generated can be translated by a dedicated reading electronic circuit of the tactile device which then makes it possible to address the activated key. In this example a power supply of the tactile keyboard is not indispensable.

The invention claimed is:

1. A device for converting heat energy into electrical energy, comprising:
a support;
a conductive circuit wherein an induced current is intended to flow;
a set of magnetic particles which are magnetized and with a ferromagnetic material base, with the particles being connected to the support using a heat-sensitive attachment structure configured to maintain the magnetic particles in at least one first position with respect to the conductive circuit when the device is subjected to a first temperature,
the heat-sensitive attachment structure comprising heat-sensitive polymer attaching molecules of at least one first type, with the polymer attaching molecules being sensitive to temperature, such that, when the attaching molecules of the first type are subjected to a given variation in temperature from the first temperature to a second temperature, the attachment structure moves the magnetic particles from the first position to a second position with respect to the conductive circuit, with the movement of the magnetic particles from the first position to the second position inducing a current in the conductive circuit.

2. The device according to claim 1, wherein the attaching molecules of the first type are molecules that have a characteristic transition temperature located between the first temperature and the second temperature and are adapted when they are subjected to the given variation in the temperature to pass from a first configuration to a second configuration, the attaching molecules of the first type being further adapted to, when they are subjected to an inverse variation in the temperature between the second temperature and the first temperature, pass from the second configuration to the first configuration.

3. The device according to claim 2, wherein in the first configuration the attaching molecules have a given affinity for water, hydrophilic or hydrophobic, in the second configuration the attaching molecules having an affinity for water that is the inverse of the given affinity.

4. The device according to claim 1, wherein the attachment structure further comprises attaching molecules of at least a second type, the second type attaching molecules being sensitive to temperature.

5. The device according to claim 4, wherein the magnetic particles are connected to a first zone of the support by attaching molecules of the first type and to a second zone of the support by attaching molecules of the second type.

6. The device according to claim 4, wherein the attaching molecules of the second type are molecules that have a characteristic transition temperature located between a third temperature and a fourth temperature, the attaching molecules of the second type being further configured such that when they are subjected to a variation in temperature from the third temperature to the fourth temperature to change affinity for water.

7. The device according to claim 4, wherein the attaching molecules of the first type have a given affinity for water at the first temperature, the attaching molecules of the second type having another affinity for water, inversely to the given affinity at the first temperature, the attaching molecules of the second type having a given affinity for water at a second temperature, the attaching molecules of the first type having an affinity for water inversely of the given affinity to the second temperature.

8. The device according to claim 1, wherein the magnetic particles are connected to a first zone of the support by attaching molecules and to a second zone of the support by attaching molecules, wherein the conductive circuit is arranged on the support to form a conductive winding about an axis passing through the first zone and the second zone of the support, and forming a non-zero angle, or an orthogonal angle, in relation to a main plane of the support.

9. The device according to claim 1, wherein the particles are formed of a body with a magnetic material base coated with an adhesive layer linked to the attaching molecules.

10. The device according to claim 1, wherein the support is a substrate with a polymer material base.

11. The device according to claim 1, wherein among the attaching molecules sensitive to the temperature are one or plural of the following polymers:
PolyNipam, Polyvinylcaprolactamc, Hydroxypropylcellulose, Polyoxazoline, Polyvinylmcthylether, Polyethyleneglycol.

12. A system for recovering and converting heat energy into electrical energy comprising:
the device for converting heat energy into electrical energy according to claim 1;
means for applying a variable heat flow to the device for converting heat energy into electrical energy.

13. A method for producing a device according to claim 1, wherein the attaching molecules have a polymer base sensitive to the temperature, with the method comprising grafting magnetic particles to the molecules of polymer.

14. The method according to claim 13, wherein the support is formed from a first substrate, comprising carrying out in the first substrate of at least one first cavity and of at least one second cavity around the first cavity, the attaching molecules being fixed in the second cavity, the conductive circuit being formed in the second cavity.

15. The method according to claim 13, comprising:
fastening a first set of polymer attaching molecules sensitive to the temperature onto the first substrate;
fastening a second set of polymer attaching molecules sensitive to the temperature onto a second substrate, then assembly of the first substrate and of the second substrate to form the support.

* * * * *